United States Patent [19]

Houdart et al.

[11] Patent Number: 4,523,163

[45] Date of Patent: Jun. 11, 1985

[54] WIDEBAND MICROWAVE DEVICE GENERATING EVEN HARMONICS OF AN INCIDENT SIGNAL

[75] Inventors: Michel Houdart; Edouard Arruberrenal; Frédéric Maurette, all of Paris, France

[73] Assignee: Thomson-CSF, Paris, France

[21] Appl. No.: 423,317

[22] Filed: Sep. 24, 1982

[30] Foreign Application Priority Data

Oct. 23, 1981 [FR] France .................................. 81 19939

[51] Int. Cl.³ ............................................ H03B 19/00
[52] U.S. Cl. .................................... 333/218; 333/247; 333/128; 363/159; 328/16
[58] Field of Search ............... 333/218, 128, 247, 246, 333/127, 136; 363/159, 158; 455/327, 328, 330, 323; 328/15, 16, 19, 20

[56] References Cited

U.S. PATENT DOCUMENTS 3,348,125 10/1967 Wieman ............................... 363/158
3,678,395 7/1972 Hunton et al. ................ 332/43 B X
4,152,680 5/1979 Harrison ......................... 333/218 X
4,266,208 5/1981 Cornish ................................ 333/218

FOREIGN PATENT DOCUMENTS 1152113 5/1969 United Kingdom .

OTHER PUBLICATIONS

Patent Abstracts of Japan, vol. 5, No. 55, Apr. 16, 1981, p. 727E52.
Ogava et al., K-Band Integrated Double Balanced Mixer, IEEE Transactions on Microwave Theory & Technique, vol. 28, No. 3, Mar. 1980, pp. 180–185.
Kohler, J. and Schieck, B., "Broadband Microwave Frequency Doubler", *The Radio and Electronic Engineer*, vol. 48, No. 1/2, Jan./Feb. 1978, pp. 31–32.

*Primary Examiner*—Eugene R. Laroche
*Assistant Examiner*—Benny T. Lee
*Attorney, Agent, or Firm*—Cushman, Darby and Cushman

[57] ABSTRACT

A wideband microwave device for generating even harmonics of an incident microwave signal. A co-planar-type input structure conducts an incident microwave signal with an asymmetrical propagation mode. Two asymmetrical mode outputs of an equiphase divider are applied to respective inputs of two nonlinear circuit structures, whose respective output signals include even harmonics of the incident signal. The two outputs signals are combined in a circuit having an asymmetrical propagation mode output and which may be followed by a filtering circuit helping to isolate the desired even harmonic.

3 Claims, 5 Drawing Figures

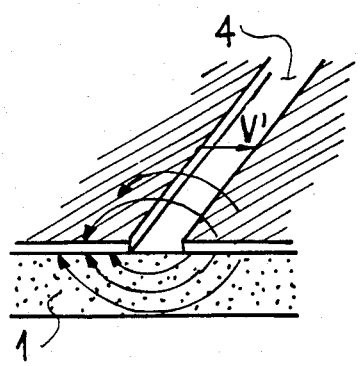
FIG_1-a
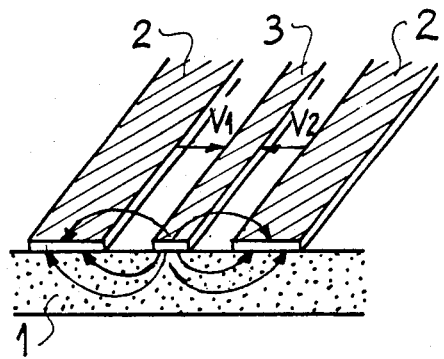
FIG_1-b
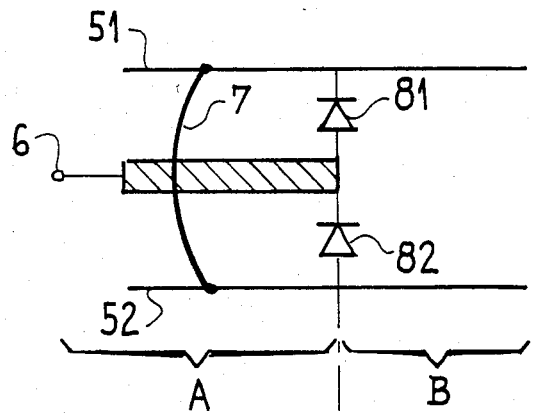
FIG_2 (PRIOR ART)

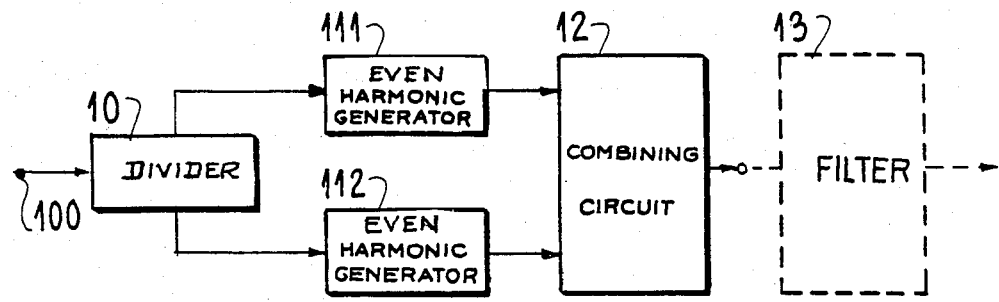
FIG_3
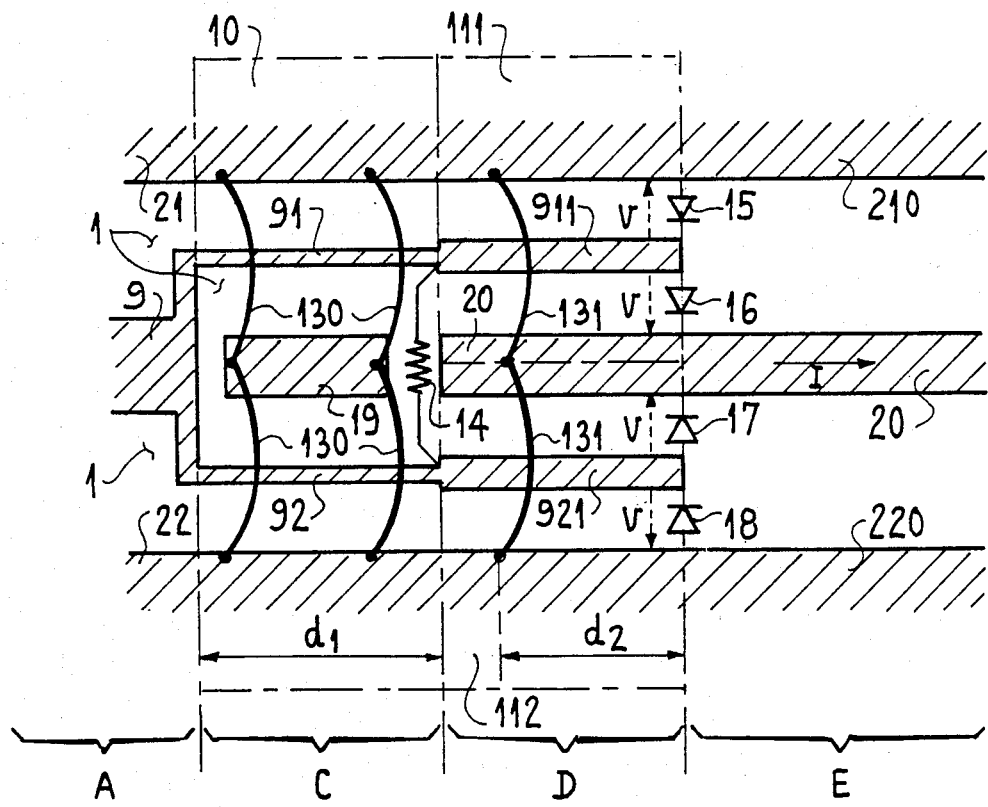
FIG_4

WIDEBAND MICROWAVE DEVICE GENERATING EVEN HARMONICS OF AN INCIDENT SIGNAL

BACKGROUND OF THE INVENTION

The present invention relates to a wideband microwave device, generating even harmonics of an incident signal.

A frequency doubling circuit is only one particular embodiment of the circuit according to the present invention. Several embodiments of frequency doublers are known among which are those which use a frequency duplexer.

A signal, whose frequency is to be doubled, is injected into the low channel output, corresponding to the low-pass filter, branched to the common channel comprising a non-linear element such as a Schottky diode. The high channel output of the duplexer then supplies the harmonics generated by the non-linear element. The uneven harmonics are rejected by filtering at the output of the high-pass filter of the duplexer. This filtering constitutes one of the main disadvantages of this type of doubler, because it limits the operating frequency band thereof. The insertion losses of the duplexer circuit results in a considerable reduction in the conversion efficiency. Another type of doubler utilizes a mixer. The fundamental signal is supplied to the input of a power divider, whose two outputs having identical frequencies, are applied to the so called "local oscillator" and "signal inputs" of a mixer. The "intermediate frequency" output of the mixer provides a signal having a frequency equal to the sum of the frequencies of the input signals, i.e. double the frequency of the incident fundamental signal.

The circuit formed by the combination of a power divider and a mixer does indeed form a frequency doubler, but has certain disadvantages. It is vital to use a mixer having a very good rejection of the second harmonics between the "local oscillator" input and the output of the mixer in order to be able to isolate the signal, whose frequency corresponds to the sum $f_{oL}+f_s$ of the input frequencies. Moreover, it is difficult to produce mixers, whose inputs have sufficiently wide bandwidth to ensure an appropriate frequency coverage at the output. The so called asymmetrical/symmetrical has been described in the article by J. KOHLER and B. SCHIECK in "The Radio and Electronic Engineer", Vol. 48, No. 1/2, January/February 1978, pp. 29-32 and entitled "Broadband Microwave Frequency Doublers".

Such a doubler is explained in greater detail in the description relative to FIG. 2. Briefly it comprises a pair of non-linear elements located at the point at which an asymmetrical propagation line forming the input of the circuit and a symmetrical propagation line forming the output meet. The input of the circuit described in this article is a coplanar line, whilst the output is a slotline, the non-linear elements used being Schottky diodes. This circuit, which is simple to structurally configure, has the disadvantage of not being usable in the lowest part of the microwave frequency spectrum, due to the operating limits of the slotline used at the output.

BRIEF SUMMARY OF THE INVENTION

The microwave circuit according to the present invention and for which the frequency doubler only constitutes a particular case, makes it possible to obviate the aforementioned disadvantages.

The present invention relates to a wideband microwave device making it possible to generate an output signal at even harmonics of an incident signal, which output signal has a high rejection ratio of the uneven harmonic and fundamental components and each of whose input and output conduct signals in an asymmetrical propagation mode.

An object of the present invention is to provide a microwave device making it possible to generate the 2n harmonic of the incident signal (fundamental frequency = n) with a high rejection ratio of uneven harmonics, of even harmonics other than 2n and of the fundamental component.

Another object of the invention is to provide a microwave device for generating even harmonics of incident signal particularly simple planar structure which makes it easily used in an integrated microwave system.

The structural configuration of the present invention has the advantage of an optimum conversion efficiency, which is constant over the frequency band used.

The structural configuration of the invention also has the advantage of a good phase-linearity for a frequency-modulated incident signal.

According to the present invention the wideband microwave device making it possible to generate a signal formed from the even harmonics of the incident signal includes: an equiphase divider circuit, whose input line and two output lines have an asymmetrical propagation mode, first and second non-linear means which, supplied by the output signals of the equiphase divider, respectively supply on a symmetrical propagation mode line a signal formed from the even harmonics of the input signal, the two output signals being combined in a circuit, whose output is formed by an asymmetrical propagation line.

BRIEF DESCRIPTION OF THE DRAWINGS

The invention is described in greater detail hereinafter relative to non-limitative embodiments and the attached drawings, wherein show:

FIGS. 1a and 1b, the structure of a slot propagation line and a coplanar propagation line, respectively.

FIG. 2, a microwave frequency doubler device of the prior art;

FIG. 3 the schematic diagram of the microwave device according to the invention; and FIG. 4 a detailed embodiment of the microwave device according to the invention.

DETAILED DESCRIPTION OF THE PREFERRED EMBODIMENTS

FIG. 1a shows the structure of a slot propagation line formed by two conductors defining a slot 4 making it possible to see the substrate 1 carrying the two conductors. Propagation is of the symmetrical type and V' represents the potential difference developed at the sides of slot 4.

FIG. 1b shows the structure of a coplanar propagation line carried by a dielectric material substrate 1 and having a conductor 3 surrounded by two earth planes 2. Propagation is of the asymmetrical type. The components of the electric field are symmetrical relative to the central conductor 3 and the coplanar line can be considered as being formed by two coupled slotlines, like that illustrated in FIG. 1a. V1 and V2 represent the potential difference on each of the slotlines.

FIG. 2 diagrammatically shows a microwave frequency doubler device, of the prior art which is of the asymmetrical/symmetrical type. The asymmetrical part constituting the input of the device is a coplanar line A formed from two conductors 51, 52 surrounding a third conductor 6. The symmetrical part is a slotline B constituted by the extensions of the two external conductors 51, 52. The coplanar line A and the slotline B are charged at their junction by two Schottky diodes 81, 82 having opposite polarities. A short circuit 7 placed between the two external conductors 51, 52 at distance λ/4 from the Schottky diodes 81, 82, λ being the wavelength corresponding to the double frequency of the incident signal, prevents the propagation of the antisymmetrical mode towards the coplanar line A.

The object of the present invention does not have this disadvantage, because the input and output of the microwave device are provided by coplanar lines which better lends itself to the construction of integrated microwave circuits and which are easily supplied from existing coaxial lines over a wide bandwidth. The object of the present invention makes it possible to generate even harmonics of the incident signal. When completed by a filtering circuit, it can constitute a frequency doubler or in more general terms generate the 2n harmonic of the incident signal applied to its input, with a high rejection ratio of the other even harmonics, of the uneven harmonics and of the fundamental mode.

FIG. 3 shows the schematic diagram of the microwave device according to the invention. The incident signal is applied to the input 100 of an equiphase microwave divider 10, each of whose two outputs supplies a microwave circuit 111, 112 of the asymmetrical/symmetrical type generating even harmonics of the incident signal. The symmetrical outputs of the microwave circuits 111, 112 are combined in a circuit 12, whose output is of the asymmetrical type and supplies a signal composed of even harmonics of the incident signal. This combining circuit 12 can be followed by a 2n harmonic filtering circuit 13.

FIG. 4 is a detailed diagram of a non-limitative embodiment of the microwave device according to the invention. On a dielectric material substrate 1 it comprises four portions A, C, D, E. Portion A forming the input of the device has an asymmetrical propagation mode, e.g. is a coplanar line, as in the embodiment of FIG. 4. This input coplanar line is formed by a central conductor 9 surrounded by two conductors 21, 22 forming earth planes. The central conductor 9 divides into two conductors 91, 92 surrounding an earth plane 19 which is made equipotential with the conductors 21, 22 forming an earth plane by short-circuits 130. Conductor 91, or 92, forms with the earth planes 21, or 22, and 19 a coplanar line.

The equiphase divider circuit designated by reference numeral 10 in FIG. 3 and reference letter C in FIG. 4 is consequently constituted in the embodiment of FIG. 4 by a Wilkinson T the input of which is the input line A and the two outputs of which are constituted by the two aforementioned coplanar lines comprising the conductor 91, or 92, surrounded by the earth planes 21, or 22, and 19. The ends of the central conductors 91, 92 are connected via matching resistor 14, at distance $d_1 = \lambda m/4$, from the junction of central conductor 9 with the central conductors 91, 92, λm being the average wavelength of the input operating frequency band of the microwave device. In this case, the Wilkinson-T has only one section of length $d_1 = \lambda m/4$. To increase the bandwidth of the device, a coplanar Wilkinson-T constituted by several line sections of length λm/4 can advantageously be used.

The microwave circuits, designated respectively by reference numerals 111 and 112 in FIG. 3 and making it possible to generate from an incident signal, a signal only having even harmonics, are respectively constituted in the embodiment of FIG. 4 by a coplanar part D and a part forming a slotline E. The input of each microwave circuit 111, or 112, of FIG. 3 is constituted by a coplanar line formed from a central conductor 911, or 921, extending the central conductor 91 or 92 of the corresponding output line of the Wilkinson T circuit C and surrounded by two conductors, the earth plane 21, or 22, and the conductor 20 positioned between the two conductors 911, 921. For each microwave circuit 111, or 112, of FIG. 3, the output is constituted by a slotline formed by conductors 210, or 220, and 20. According to the non-limitative embodiment of FIG. 3, the conductors 21 forming the earth plane and 210, or 22 forming the earth plane and 220, are represented in the extension of one another. At the junction of coplanar line D and slotline E, two pairs of non-linear elements, e.g. Schottky diodes 15, 16 and 17, 18 as illustrated in FIG. 4, generate the even harmonics of the incident signal and in the present case, respectively the output signal of the respective output of the Wilkinson T. The diodes of each pair 15, 16 or 17, 18 are anti-parallel mounted between central conductor 911, or 921, of coplanar line D and the respective earth planes or conductors 21 and 20 or 20 and 22, the two pairs of diodes being parallel mounted.

Conductors 210 and 20 or conductors 20 and 220 form a slotline, on considering each circuit separately. The combining circuit 12 in FIG. 3 is constituted by the same conductors 210, 20, 220 which, together, constitute a coplanar line, whose propagation is asymmetrical and which forms the output of the device according to the invention conductors 210, 220 then being the earth planes of the output coplanar line.

The output signal is asymmetrically available on this line. Short-circuits 131 between conductors 21, 20 and 22 positioned on part D at a distance $d_2 = (\lambda/8n)$ upstream of the Schottky diodes 15, 16, 17, 18, λ being the wavelength of the incident signal of frequency $f_o$ applied to the input of the device according to the invention and n being an integer, prevent the propagation of the 2n harmonic of the incident signal towards the coplanar side D of each circuit 111 or 112 of FIG. 3 and consequently allows a signal in which the level of the component corresponding to the 2n harmonic of the incident signal is increased compared with that of the other even harmonics forming it to be generated at the output E of the present device.

The operating principle of the device according to the invention is as follows: It is assumed that the voltage developed at the terminals of each diode 15, 16, 17 or 18 is of form:

$$v = V_o \cos 2\pi f_{ot}$$

in which $f_o$ is the fundamental frequency of the incident signal. The potential difference is represented at the terminals of each diode by v in FIG. 4. The characteristics of the Schottky diode, which is the nonlinear element used in the embodiment of FIG. 4, can be approximated by the equation: $i_j = I_s[\exp(\alpha v_T) - 1]$ giving the value of current $i_j$ circulating in the Schottky diode, $v_T$ being equal to v for diodes 15 and 18 and to (−v) for diodes 16 and 17 and j being respectively equal fo 1, 2, 3, or 4 for diodes 15, 16, 17 or 18.

The current I circulating in the central conductor 20 of coplanar line E at the output of the device according to the invention is equal to:

$$I = i_1 + i_2 + i_3 + i_4$$

Therefore:

$$I = 2Is[\exp(\alpha v) + \exp(-\alpha v) - 2] \text{ or:}$$

$$I = 4Is[\cosh(\alpha v) - 1] \quad (1)$$

with $v = V_o \cos 2\pi f_o t$.

On breaking down the above expression (1) into Fourier's series, we obtain terms of form $I_k \cos(2k \cdot 2\pi f_{ot})$ $$I = \sum_k I_k \cos(2k \cdot 2\pi f_{ot}).$$

Thus, this corresponds to a device generating with an asymmetrical propagation mode even harmonics from an incident microwave signal of frequency $f_o$.

The short-circuit located at distance $d_2 = (\lambda/8n)$ from the non-linear elements on the coplanar side makes it possible to set an infinite impedance at the terminals of each pair of elements at frequency $f = 2n\, f_o$, i.e. for the 2n harmonic of the incident signal, which increases the level of the 2n harmonic, whilst preventing its propagation towards the input of the device.

The optimum determination of the widths and lengths of the different conductive areas is known by those skilled in the art and makes it possible to obtain the above-mentioned characteristics over a very wide frequency range.

The embodiment described in FIG. 4 is to be considered exemplary and not limitative. The input and output need not be coplanar and can instead be coaxial or in some other form. For example, it is possible to use an equiphase divider circuit other than a Wilkinson T having one or more sections of length λm/4 described in the present invention. For example, it could be a hybrid ring or a simple division of propagation lines (T junction). In the same way, non-linear elements other than the Schottky diodes of embodiment of FIG. 4 can be used.

The bandwidth of the microwave device according to the invention is in practice limited by:

the bandwidth of the divider circuit used, the voltage standing wave ratio at the input and at the output linked on the one hand with the technology used for the conductive surfaces which must be perfectly insulated and on the other hand with the quality of the semiconductor elements used, parasitic elements limiting the bandwidth of the circuit, in the case of the embodiment of FIG. 4, the definition of the combining circuit bringing a purely reactive impedance in parallel on each of the pairs of diodes:

$$Z_s = j Z_{14} \tan \frac{w_o d_2}{V_{14}} = j Z_{24} \tan \frac{w_o d_2}{V_{24}}$$

in which $Z_{14}$ and $Z_{24}$ are characteristic impedances of the slotlines constituted by conductors 210, 20 and 220, 20 respectively, $V_{14}$ and $V_{24}$ being the propagation rate of these two lines, $\omega_o$ the pulsation of the incident signal and d2 the distance $\lambda/8n$.

The conversion efficiency of the microwave device according to the invention is dependent on the power of the incident signal applied to the input.

The present invention is applicable to microwave systems requiring a transposition of the frequency range.

What is claimed is:

1. A microwave harmonic generator, comprising:

an equiphase divider having an input structure for conducting an input signal at a fundamental frequency with an asymmetrical propagation mode and first and second output structures, each for conducting an output signal at the fundamental frequency with an asymmetrical propagation mode;

first and second even harmonic generator structures, each having an input structure coupled to a corresponding output structure of said equiphase divider, each harmonic generator providing an output signal on an output structure thereof in a symmetrical propagation mode including even harmonics of said fundamental frequency; and a combining circuit structure means for receiving said symmetrical mode output signals from said first and second harmonic generators and providing a combined signal on an output structure over an asymmetrical propagation mode, wherein the microwave harmonic generator is fabricated on a dielectric substrate, and wherein the equiphase divider includes said input structure including a central conductor between first and second equipotential earth planes, said central conductor dividing into first and second conductors with a third earth plane therebetween, the third earth plane being made equipotential with the first and second earth planes by short circuits, the first and second conductors each forming with the third earth plane and the first and second earth planes respective first and second coplanar lines, which form the first and second output structures respectively, the first and second coplanar lines being resistor coupled to each other at respective output ends thereof.

2. A microwave harmonic generator according to claim 1 wherein said first and second harmonic generators together comprise:

third and fourth conductors coupled to said output ends of said first and second conductors and a fourth earth plane therebetween, each of said third and fourth conductors having an output end, the output end of said third conductor being diode coupled to said first earth plane and diode coupled to said fourth earth plane, the output end of said fourth conductor being diode coupled to said fourth earth plane and diode coupled to said second earth plane.

3. A microwave harmonic generator according to claim 2 wherein the combining circuit structure comprises a central conductor formed as an extension of said fourth earth plane.

* * * * *